United States Patent
Teh et al.

(10) Patent No.: US 12,266,702 B2
(45) Date of Patent: Apr. 1, 2025

(54) FLASH MEMORY DEVICES WITH THICKENED SOURCE/DRAIN SILICIDE

(71) Applicant: GlobalFoundries Singapore Pte. Ltd., Singapore (SG)

(72) Inventors: Young Way Teh, Singapore (SG); Bin Zhu, Singapore (SG); Madhu Sudan Mukhopadhyay, Singapore (SG); Subramanian Sundareswara, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 447 days.

(21) Appl. No.: 17/834,982

(22) Filed: Jun. 8, 2022

(65) Prior Publication Data
US 2023/0402516 A1    Dec. 14, 2023

(51) Int. Cl.
| | |
|---|---|
| *H01L 29/417* | (2006.01) |
| *H10B 41/10* | (2023.01) |
| *H10B 41/23* | (2023.01) |
| *H10B 43/10* | (2023.01) |
| *H10B 43/23* | (2023.01) |
| *H10D 62/10* | (2025.01) |
| *H10D 64/23* | (2025.01) |

(52) U.S. Cl.
CPC .......... *H10D 64/259* (2025.01); *H10B 41/10* (2023.02); *H10B 41/23* (2023.02); *H10B 43/10* (2023.02); *H10B 43/23* (2023.02); *H10D 62/115* (2025.01)

(58) Field of Classification Search
CPC .......... H01L 29/0649; H01L 29/41783; H01L 29/42324; H01L 29/66825; H01L 2924/1438
USPC .................................... 257/314, 326
See application file for complete search history.

(56) References Cited

U.S. PATENT DOCUMENTS 8,773,903 B2    7/2014  Lee et al.
2019/0355672 A1*  11/2019  Fujita .................. H01L 23/5226

* cited by examiner

*Primary Examiner* — Hoai V Pham
(74) *Attorney, Agent, or Firm* — Thompson Hine LLP

(57) ABSTRACT

Structures for a memory device and methods of forming a structure for a memory device. The structure includes a first and second source/drain regions in a semiconductor substrate, a first gate stack on the semiconductor substrate, and a second gate stack on the semiconductor substrate adjacent to the first gate stack. The first and second gate stacks are positioned in a lateral direction between the first source/drain region and the second source/drain region. The first gate stack includes first and second gate electrodes, and the first gate electrode includes segments spaced apart along a longitudinal axis of the first gate stack.

20 Claims, 7 Drawing Sheets

FLASH MEMORY DEVICES WITH THICKENED SOURCE/DRAIN SILICIDE

BACKGROUND

The invention relates generally to integrated circuits and semiconductor device fabrication and, more specifically, to structures for a memory device and methods of forming a structure for a memory device.

Non-volatile memories are utilized in various electronic products for general storage and transfer of data. Stored data is retained by a non-volatile memory device when the memory cells are not powered. The persistence of data storage by a non-volatile memory device contrasts with volatile memory technologies, such as a static random-access memory (SRAM) device in which stored data is eventually lost when the memory cells are unpowered and a dynamic random-access memory (DRAM) device in which stored data is lost if the memory cells are not periodically refreshed.

Flash memory is a particular type of non-volatile memory with memory cells that can be repeatedly programmed and erased. Embedded flash memory may be used to store configuration settings, program code, application parameters, and other types of data in consumer, industrial, and automotive electronic products. Each memory cell of a flash memory resembles a standard metal-oxide-semiconductor field-effect transistor, but is equipped with multiple gates instead of a single gate. Current flow in a channel region between the source and drain is controlled by a stacked gate that includes a floating gate and a control gate. Charge stored on the floating gate, which changes the threshold voltage of the stacked gate, provides different memory logic states.

Improved structures for a memory device and methods of forming a structure for a memory device are needed.

SUMMARY

In an embodiment, a structure for a memory device is provided. The structure comprises a first source/drain region and a second source/drain region in a semiconductor substrate, a first gate stack on the semiconductor substrate, and a second gate stack on the semiconductor substrate adjacent to the first gate stack. The first gate stack and the second gate stack are positioned in a lateral direction between the first source/drain region and the second source/drain region. The first gate stack includes a first gate electrode and a second gate electrode, and the first gate electrode includes a plurality of segments spaced apart along a longitudinal axis of the first gate stack.

In an embodiment, a method of forming a memory device is provided. The method comprises forming a first source/drain region and a second source/drain region in a semiconductor substrate, and forming a first gate stack on the semiconductor substrate. The first gate stack is positioned in a lateral direction between the first source/drain region and the second source/drain region, the first gate stack includes a first gate electrode and a second gate electrode, and the second gate electrode has a plurality of segments spaced apart along a longitudinal axis of the first gate stack. The method further comprises forming a second gate stack on the semiconductor substrate adjacent to the first gate stack. The second gate stack is positioned in the lateral direction between the first source/drain region and the second source/drain region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
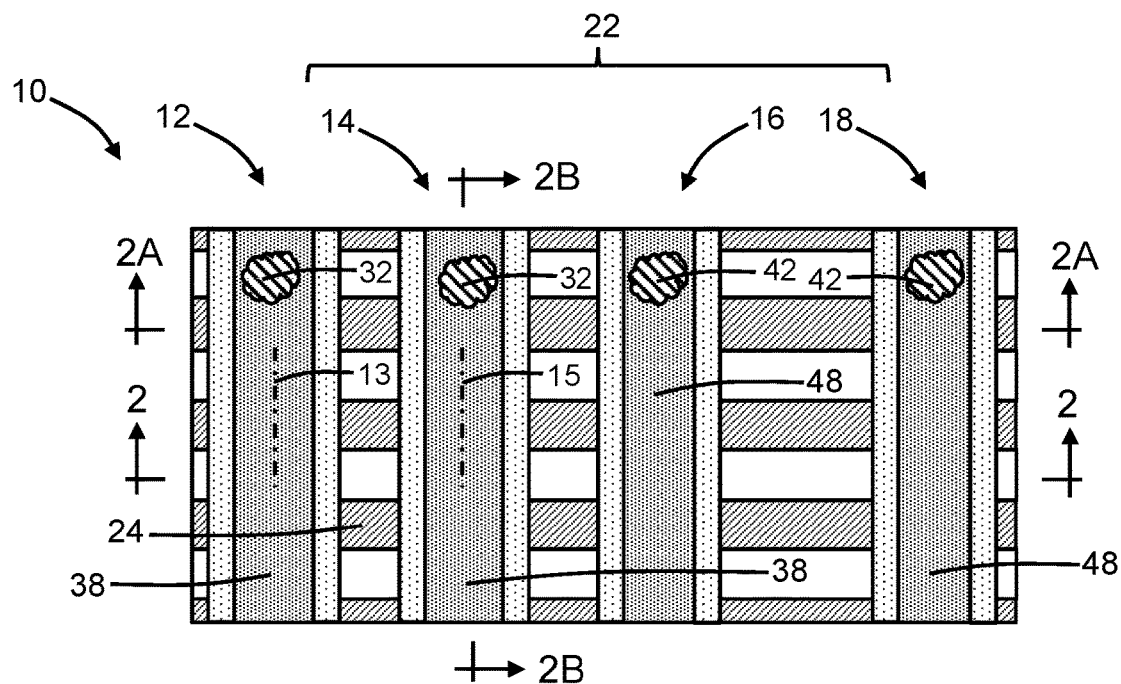
FIG. 1 is a top view of a structure for a split gate flash memory cell in accordance with embodiments of the invention.
Figure 2:
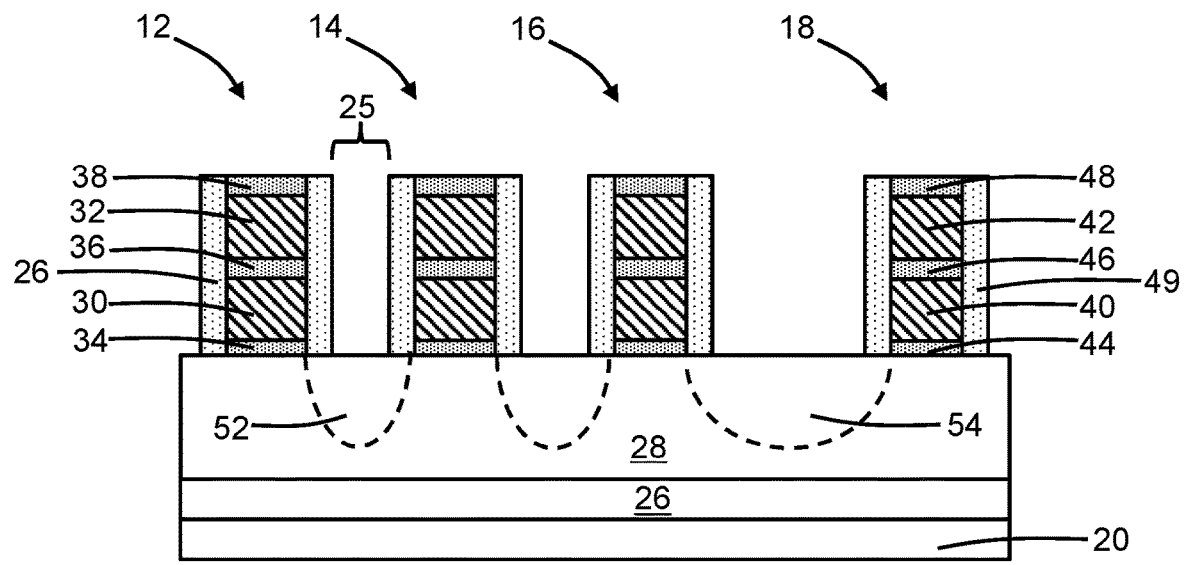
FIG. 2 is a cross-sectional view taken generally along line 2-2 in FIG. 1.
Figure 2A:
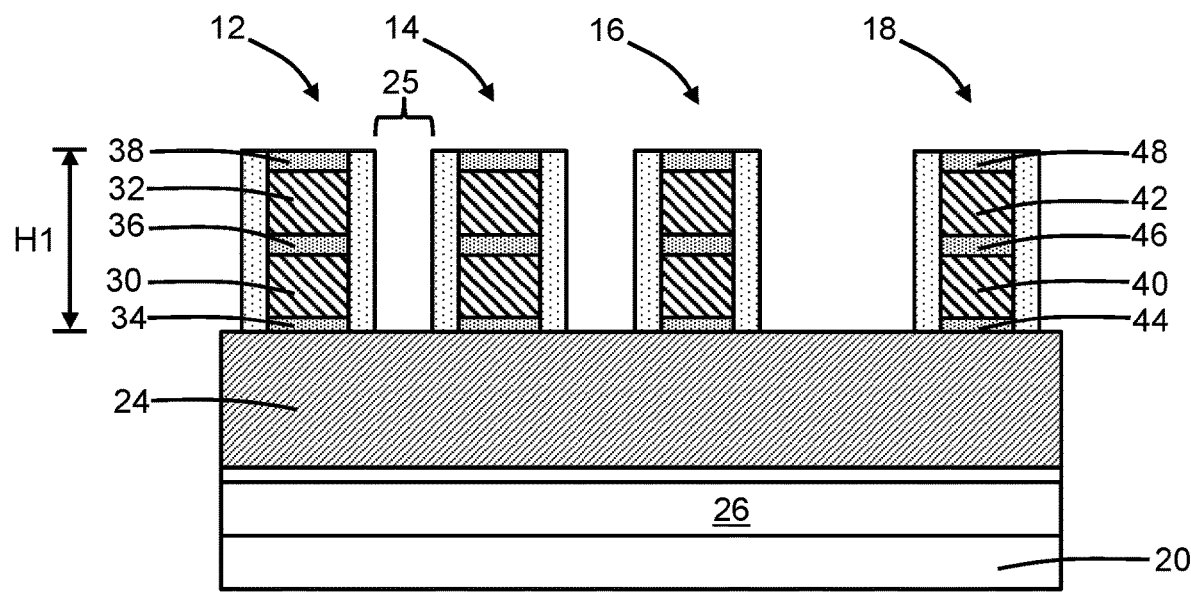
FIG. 2A is a cross-sectional view taken generally along line 2A-2A in FIG. 1.
Figure 2B:
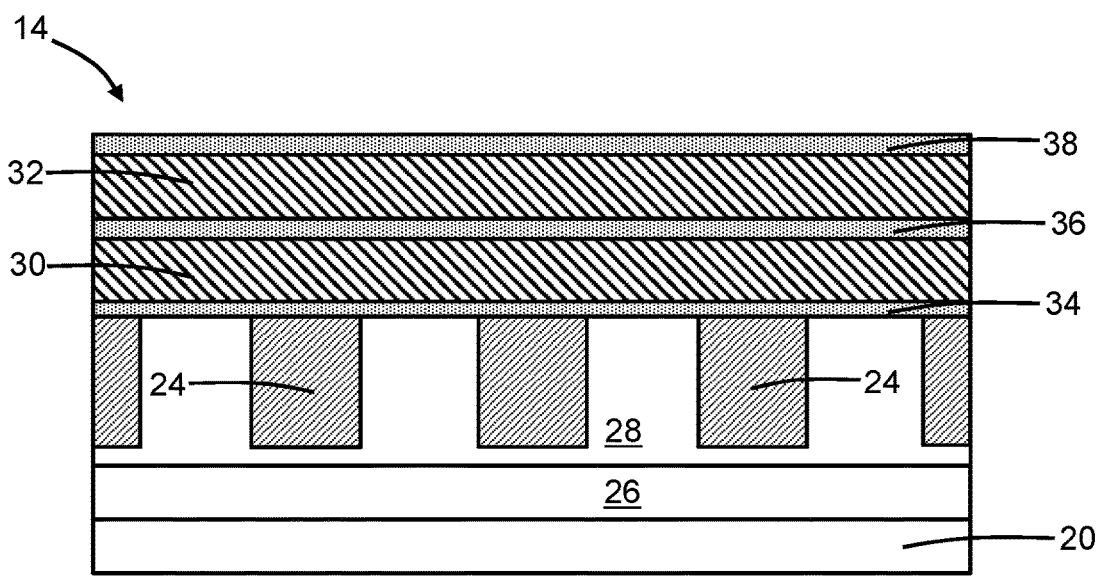
FIG. 2B is a cross-sectional view taken generally along line 2B-2B in FIG. 1.
Figure 3:
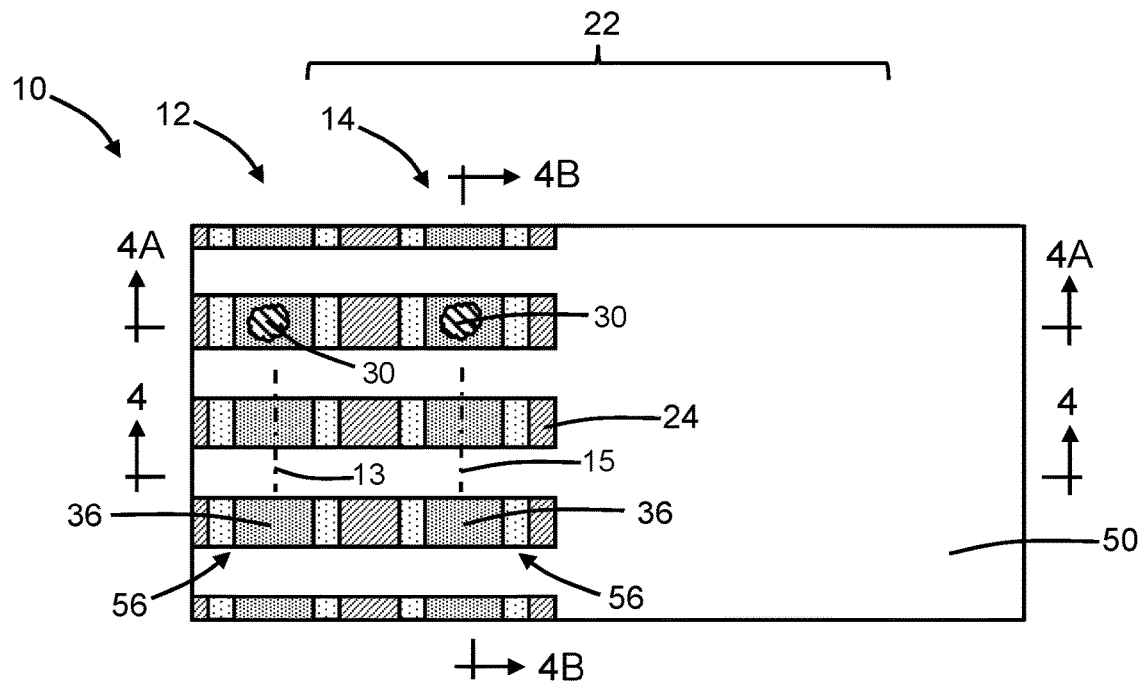
FIG. 3 is a cross-sectional view of the structure at a fabrication stage subsequent to FIG. 1.

With reference to FIGS. 1, 2, 2A, 2B and in accordance with embodiments of the invention, a structure 10 includes an access gate transistor 12, an access gate transistor 14, a stacked gate transistor 16, and a stacked gate transistor 18 that are formed on a semiconductor substrate 20. The access gate transistor 14 and the stacked gate transistor 16 define a transistor pair of a flash memory cell 22. The access gate transistor 12 and stacked gate transistor 18 belong to different flash memory cells that are laterally located on opposite sides of the flash memory cell 22. The semiconductor substrate 20 may be comprised of a semiconductor material, such as single-crystal silicon, and may be lightly doped to have p-type conductivity.

Shallow trench isolation regions 24 may be formed in the semiconductor substrate 20. The shallow trench isolation regions 24 are comprised of a dielectric material, such as silicon dioxide, that is an electrical insulator. The shallow trench isolation regions 24 may be formed by patterning trenches in the semiconductor substrate 20 with lithography and etching processes, depositing a dielectric material to fill the trenches, and planarizing and/or recessing the deposited dielectric material.

A well 26 may be formed in the semiconductor substrate 20. The well 26, which is doped to have an opposite conductivity type from the semiconductor substrate 20, may be formed by introducing a dopant by, for example, ion implantation into the semiconductor substrate 20. Implantation conditions (e.g., ion species, dose, kinetic energy) may be selected to tune the electrical and physical characteristics of the well 26. In an embodiment, the well 26 may be doped with a concentration of an n-type dopant (e.g., arsenic or phosphorus) to provide n-type conductivity.

A well 28 may be formed in the semiconductor substrate 20. The well 28 is positioned in a vertical direction between the top surface of the semiconductor substrate 20 and the well 26, and may extend to the top surface of the semiconductor substrate 20. The well 28, which is doped to have a conductivity type that is opposite to the conductivity type of the well 26 and the same conductivity type as the semiconductor substrate 20, may be formed by introducing a dopant by, for example, ion implantation into the semiconductor substrate 20. The implantation conditions (e.g., ion species, dose, kinetic energy) may be selected to tune the electrical and physical characteristics of the well 28. In an embodiment, the well 28 may be doped with a concentration of a p-type dopant (e.g., boron) to provide p-type conductivity.

Each of the access gate transistors 12, 14 includes a gate stack having a gate electrode 30, a gate electrode 32, a dielectric layer 34 between the gate electrode 30 and the top surface of the semiconductor substrate 20, and a dielectric layer 36 between the gate electrode 30 and the gate electrode 32. A cap layer 38 may be located over the gate electrode 32, and the gate stack may be clad by sidewall spacers 39. The gate stack of the access gate transistor 12 is positioned adjacent to the gate stack of the access gate transistor 14, and the gate stack of the access gate transistor 12 is spaced in a lateral direction apart from the gate stack of the access gate transistor 14 by a gap 25.

The gate stacks of the access gate transistors 12, 14 have a height H1 relative to the top surface of the semiconductor substrate 20. The gate electrodes 30, 32 in each gate stack provide respective portions of the total height H1. For each gate stack, the gate electrode 30 is positioned in a vertical direction between the gate electrode 32 and the semiconductor substrate 20, and is also positioned in a vertical direction between the gate electrode 32 and the trench isolation regions 24. The gate stack of the access gate transistor 12 is lengthwise aligned along a longitudinal axis 13, and the gate stack of the access gate transistor 14 is lengthwise aligned along a longitudinal axis 15. In an embodiment, the longitudinal axis 13 of the gate stack of the access gate transistor 12 may be aligned parallel to the longitudinal axis 15 of the gate stack of the access gate transistor 14. The gate electrode 30 in each gate stack provides an access gate of the access gate transistors 12, 14, and the gate electrode 32 in each gate stack is non-functional.

Each of the stacked gate transistors 16, 18 includes a gate stack having a gate electrode 40, a gate electrode 42, a dielectric layer 44 between the gate electrode 40 and the top surface of the semiconductor substrate 20, and a dielectric layer 46 between the gate electrode 40 and the gate electrode 42. A cap layer 48 may be located over the gate electrode 42, and the gate stack may be clad by sidewall spacers 49. The gate stacks of the stacked gate transistors 16, 18, which have adjacent positioning, may be spaced further apart in a lateral direction than the gate stacks of the access gate transistors 12, 14. The gate stacks of each of the stacked gate transistors 16, 18 may also have a height H1 relative to the top surface of the semiconductor substrate 20. The gate electrode 40 in each gate stack provides a floating gate of the stacked gate transistors 16, 18, and the gate electrode 42 in each gate stack provides a control gate of the stacked gate transistors 16, 18.

The gate electrodes 30, 32 and the gate electrodes 40, 42 may be comprised of a conductor, such as doped polysilicon. The dielectric layers 34, 44 may be comprised of a dielectric material, such as silicon dioxide. The dielectric layers 36, 46 may be comprised of a stack of dielectric materials, such as a layered stack of silicon dioxide, silicon nitride, and silicon dioxide. The cap layers 38, 48 and the sidewall spacers 39, 49 may be comprised of a dielectric material, such as silicon nitride. The gate stacks and cap layers 38 for the access gate transistors 12, 14 and the gate stacks and cap layers 48 for the stacked gate transistors 16, 18 may be formed by depositing and patterning a layer stack comprised of the different materials. The sidewall spacers 39, 49 may be formed by depositing a conformal layer of the dielectric material and anisotropically etching the deposited conformal layer.

Source/drain regions 52, 54 are located in separate portions of the semiconductor substrate 20. The source/drain regions 52, 54 are doped to have an opposite conductivity type from the well 28, and a portion of the well 28 is positioned between the source/drain regions 52, 54. The source/drain regions 52, 54 may be selectively formed by ion implantation of, for example, an n-type dopant (e.g., phosphorus or arsenic). As used herein, the term "source/drain region" means a doped region of semiconductor material that can function as either a source or a drain of a field-effect transistor. In an embodiment, the source/drain region 52 may be a source, and the source/drain region 54 may be a drain. The gate stack of the access gate transistor 14 and the gate stack of the stacked gate transistor 16 are both positioned in a lateral direction between the source/drain region 52 and the source/drain region 54. The source/drain region 52 is positioned in a lateral direction between the gate stack of the access gate transistor 12 and the gate stack of the access gate transistor 14.

With reference to FIGS. 3, 4, 4A, 4B in which like reference numerals refer to like features in FIGS. 1, 2, 2A, 2B and at a subsequent fabrication stage, the gate stacks of the access gate transistors 12, 14 are patterned by lithography and etching processes. To that end, an etch mask 50 is applied that covers the gate stacks of the stacked gate transistors 16, 18 and that exposes portions of the gate stacks of the access gate transistors 12, 14. The etch mask 50 may be formed by a lithography process in which a layer of photoresist is applied by a spin-coating process, pre-baked, exposed to light projected through a photomask, baked after exposure, and developed with a chemical developer to open portions of the gate stacks of the access gate transistors 12, 14. The exposed portions of the gate stacks of the access gate transistors 12, 14 are arranged in spaced-apart intervals along the longitudinal axes 13, 15.

An etching process may be used to remove the cap layers 38 and to also shorten the sidewall spacers 39, and an etching process may be used to remove the gate electrode 32 from the exposed portions of the gate stacks of the access gate transistors 12, 14. The gate electrode 32 is divided by the etching process into sections or segments 56 that are longitudinally spaced along the length of each gate stack. Adjacent pairs of the segments 56 are separated by a gap 58 and, in each gap 58, the gate electrode 32 may be fully removed. In an embodiment, the dielectric layer 36 may also be patterned into sections or segments along with the gate electrode 32 such that the dielectric layer 36 is removed in the gaps 58 and intact between the segments 56 and the underlying gate electrode 30. The gate electrode 30 and the dielectric layer 34, which are included in the gate stacks of the access gate transistors 12, 14, are not patterned when the gaps 58 are formed. The gate stacks of the stacked gate transistors 16, 18 are protected and unaffected by the one or more etching processes such that the height H1 is preserved. The etch mask 50 may be stripped following the one or more etching processes.

The gate stack of each of the access gate transistors 12, 14 retains the height H1 at the locations of the segments 56 of the gate electrode 32. However, due to the removal of the exposed portions of the gate electrode 32 and dielectric layer 36 in the gaps 58, the gate stack of each of the access gate transistors 12, 14 has a height H2 relative to the top surface of the semiconductor substrate 20 that is less than the height H1. In the representative embodiment, the gate electrode 30 and the dielectric layer 34 contribute to the height H2 of the gate stack in each gap 58. In an alternative embodiment, the dielectric layer 36 may not be patterned in the gaps 58 after forming the segments 56, and the dielectric layer 36 may also contribute to the height H2 of the gate stack in each gap 58.

The segments 56 of the discontinuous gate electrode 32 of the access gate transistor 12 are positioned in a spaced arrangement along the longitudinal axis 13, and the segments 56 of the discontinuous gate electrode 32 of the access gate transistor 14 are also positioned in a spaced arrangement along the longitudinal axis 15. The segments 56 and gaps 58 alternate along the longitudinal axis 13 of the access gate transistor 12. The segments 56 and gaps 58 also alternate along the longitudinal axis 15 of the access gate transistor 14.

Each gap 58 in the gate stacks of the access gate transistors 12, 14 is longitudinally positioned between an adjacent pair of segments 56. Each gap 58 in the gate stacks of the access gate transistors 12, 14 is positioned in an overlapping relationship with one of the shallow trench isolation regions 24. In an embodiment, each gap 58 may only overlap with one of the shallow trench isolation regions 24. In an embodiment, the gaps 58 in the gate stack of the access gate transistor 12 and the gaps 58 in the gate stack of the access gate transistor 14 may be aligned with each other in a lateral direction transverse to the longitudinal axes 13, 15.

The segments 56 of the gate electrode 32 in the gate stack of the access gate transistor 12 are positioned in a lateral direction adjacent to the source/drain region 52, and the segments 56 in the gate stacks of the access gate transistors 14 are also positioned in a lateral direction adjacent to the source/drain region 52. The source/drain region 52 is positioned in a lateral direction between the segments 56 of the gate electrode 32 of the access gate transistor 12 and the segments 56 of the gate electrode 32 of the access gate transistor 14. Each segment 56 has an overlapping relationship with a respective portion of the gate electrode 30 over the semiconductor substrate 20. Each segment 56 may have a non-overlapping relationship with the shallow trench isolation regions 24. For each gate stack, the gate electrode 30 is positioned in a vertical direction between the segments 56 of the gate electrode 32 and the semiconductor substrate 20, and is also positioned in a vertical direction between the gaps 58 and the trench isolation regions 24. In an embodiment, the segments 56 of the gate stack of the access gate transistor 12 and the segments 56 of the gate stack of the access gate transistor 14 may be aligned with each other in a lateral direction transverse to the longitudinal axes 13, 15.

Figure 4:
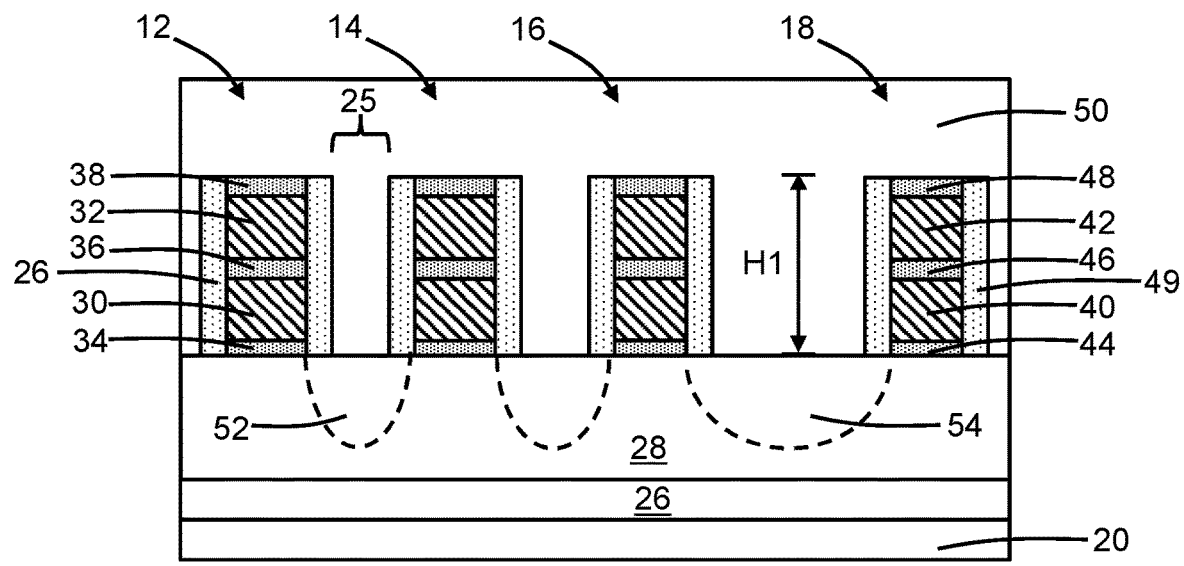
FIG. 4 is a cross-sectional view taken generally along line 4-4 in FIG. 3.
Figure 4A:
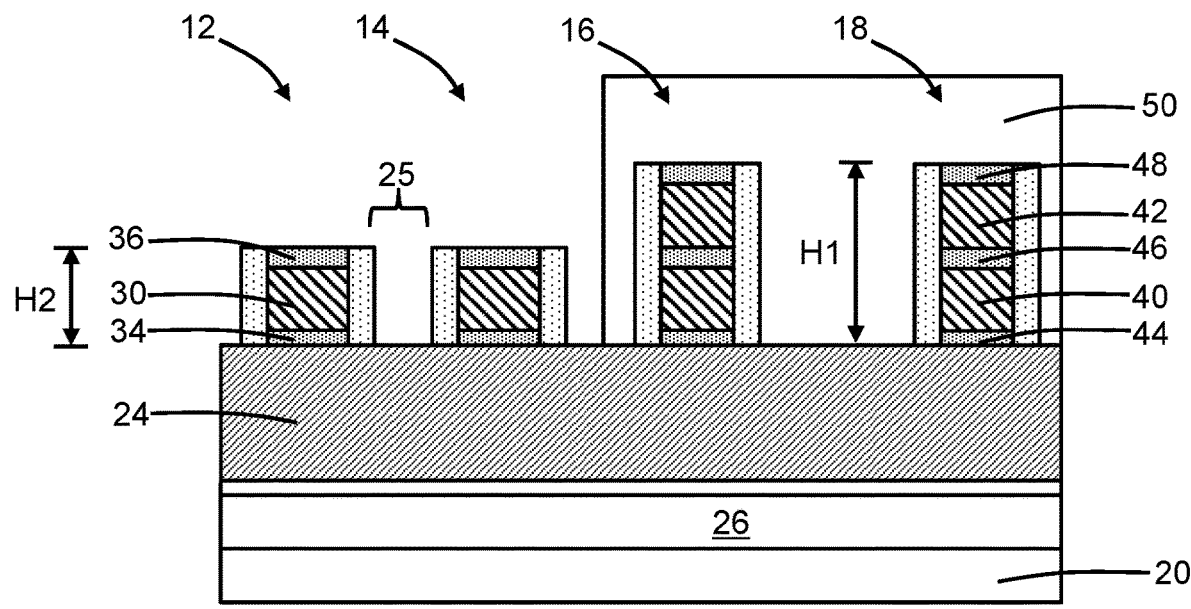
FIG. 4A is a cross-sectional view taken generally along line 4A-4A in FIG. 3.
Figure 4B:
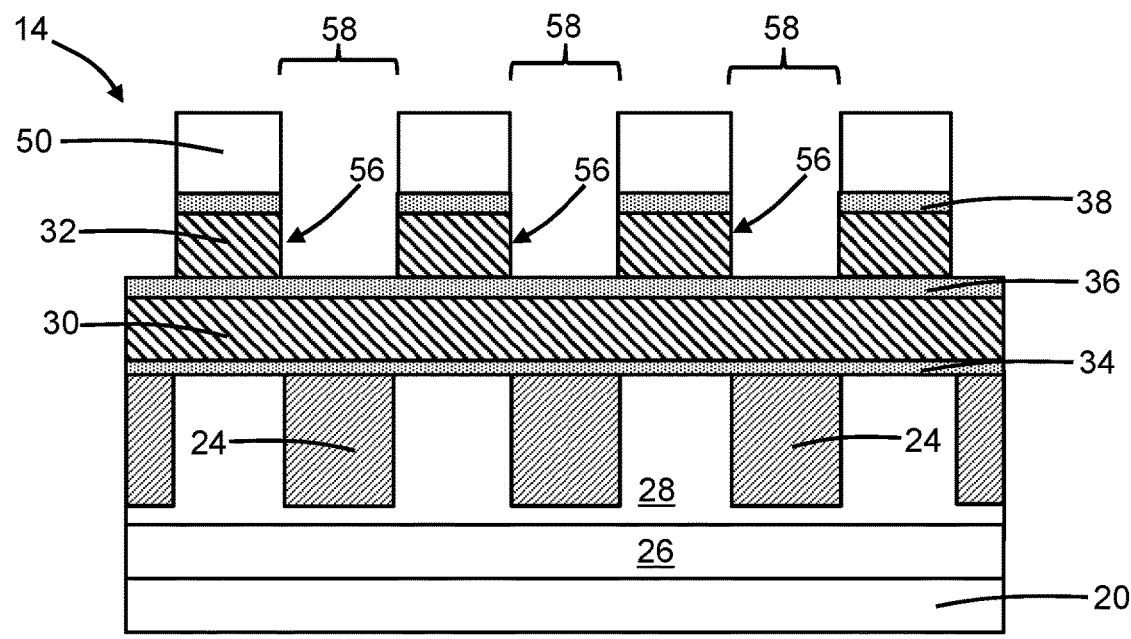
FIG. 4B is a cross-sectional view taken generally along line 4B-4B in FIG. 3.
Figure 5:
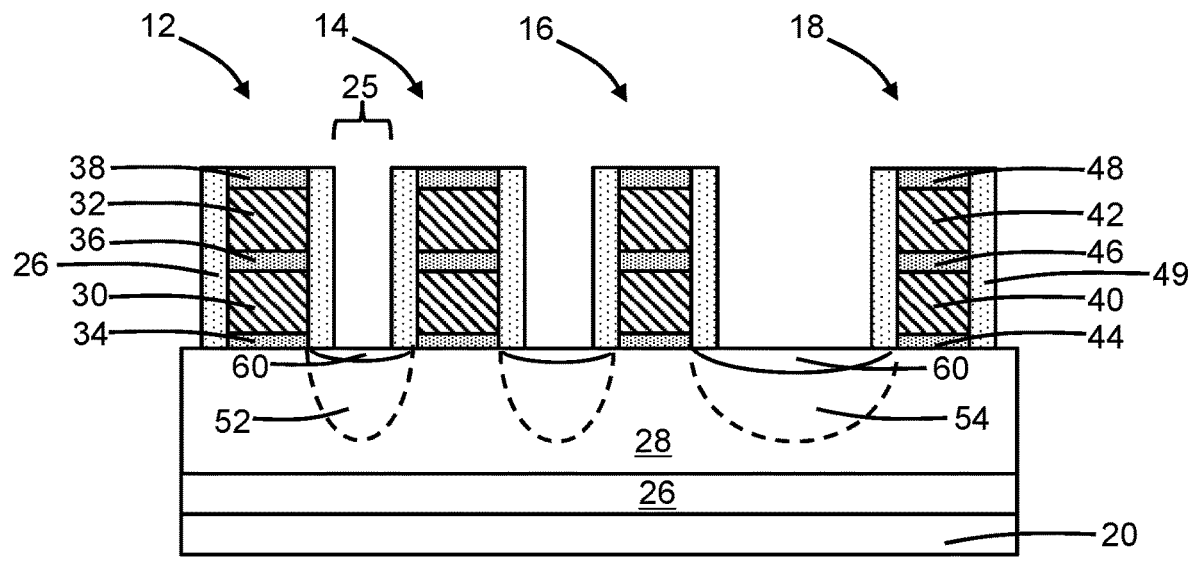
FIGS. 5, 5A, 5B are cross-sectional views of the structure at a fabrication stage subsequent to FIGS. 4, 4A, 4B.
Figure 5A:
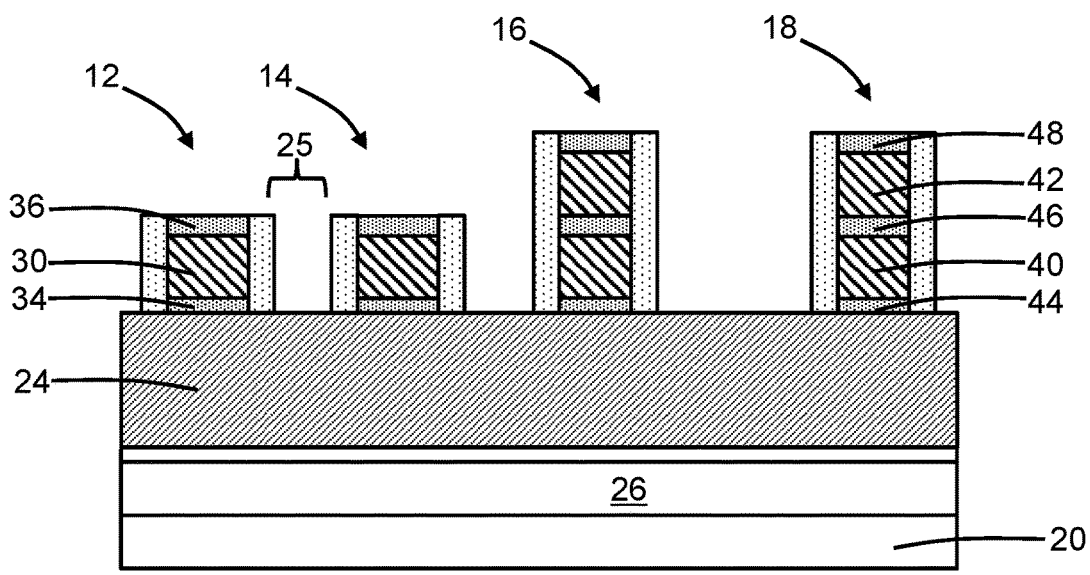
Figure 5B:
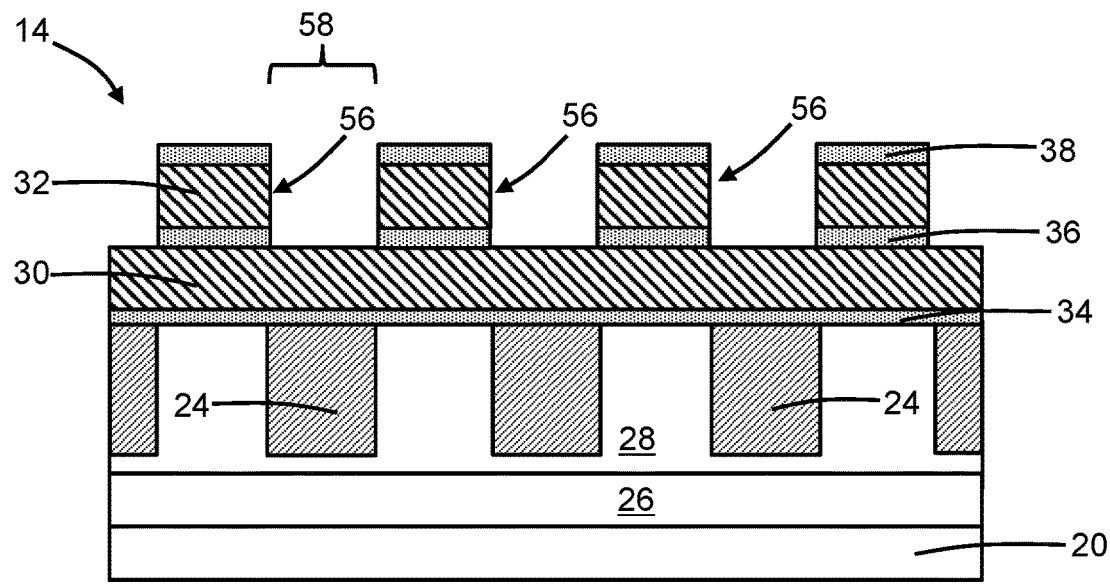

With reference to FIGS. 5, 5A, 5B in which like reference numerals refer to like features in FIGS. 4, 4A, 4B and at a subsequent fabrication stage, a silicide layer 60 is formed in sections on the semiconductor substrate 20 over the source/drain region 52 and the source/drain region 54. The silicide layer 60 may be formed by a self-aligned silicidation process that involves one or more annealing steps to form a silicide phase by reacting a layer comprised of a silicide-forming metal that is deposited on the semiconductor substrate 20. An initial annealing step of the silicidation process consumes the silicide-forming metal to form the silicide layer 60. Following the initial annealing step, any non-reacted silicide-forming metal may be removed by wet chemical etching. The silicide layer 60 may then be subjected to an additional annealing step at a higher temperature to form a lower-resistance silicide phase. In an embodiment, the silicide-forming metal may be deposited by, for example, physical vapor deposition and may be nickel that is included in a sputtered layer comprised of nickel-platinum.

The segmentation of each gate electrode 32 functions to increase the thickness of the silicide-forming metal deposited on the semiconductor substrate 20 over the source/drain region 52 by reducing the shadowing effect of the gate stacks of the access gate transistors 12, 14. The shadowing effect is reduced by reducing the height of the gate stacks of the access gate transistors 12, 14 locally in the gaps 58. The thickening of the deposited silicide-forming metal functions to increase the thickness of the silicide layer 60 that is formed by the silicidation process over source/drain region 52.

Figure 6:
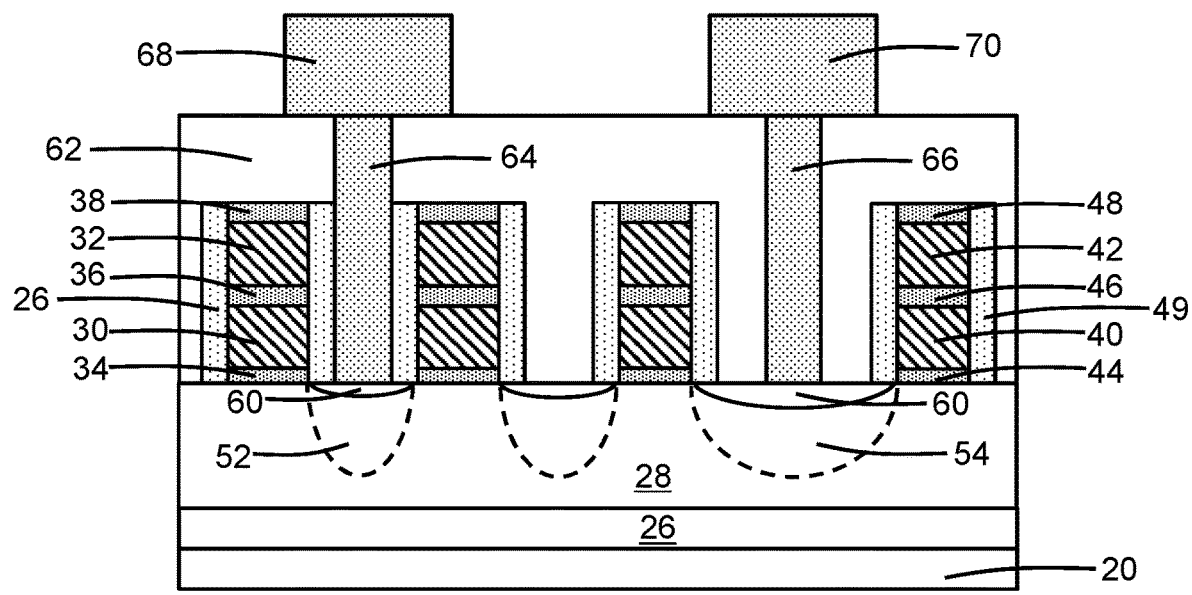
FIGS. 6, 6A, 6B are cross-sectional views of the structure at a fabrication stage subsequent to FIGS. 5, 5A, 5B.
Figure 6A:
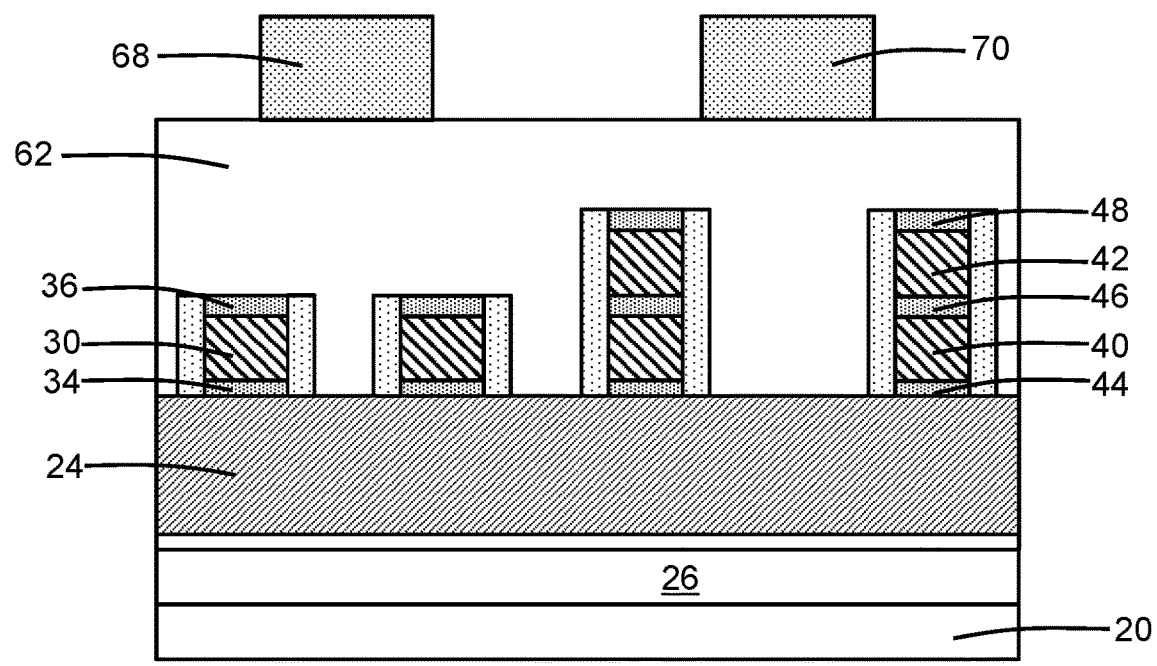
Figure 6B:
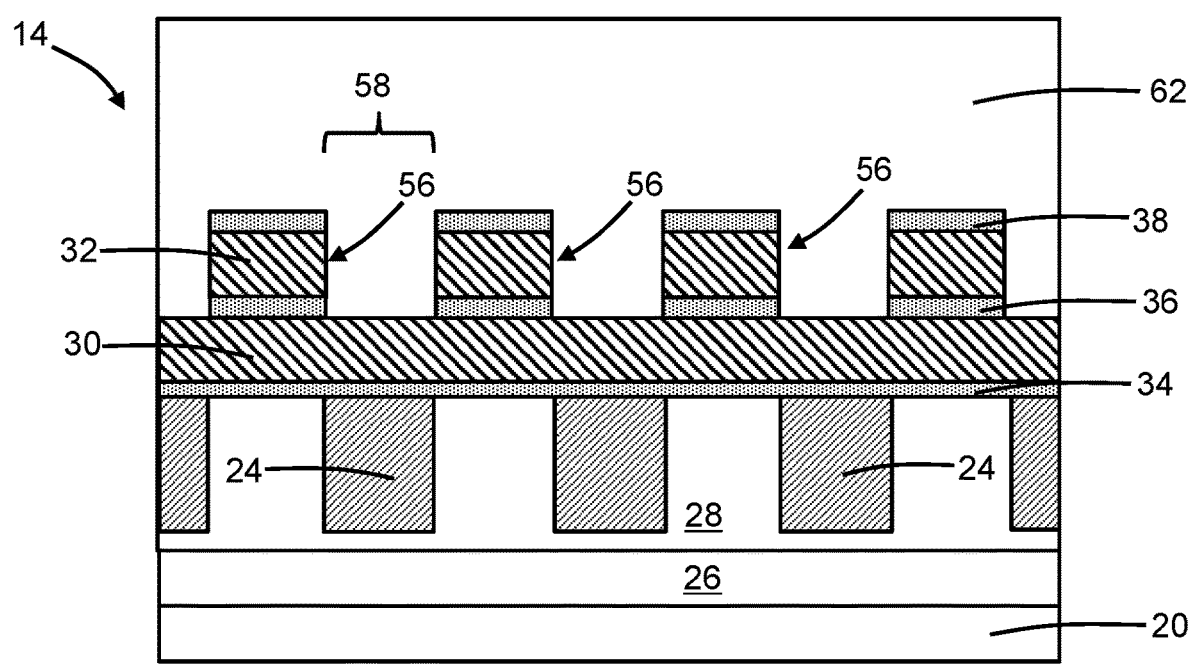

With reference to FIGS. 6, 6A, 6B in which like reference numerals refer to like features in FIGS. 5, 5A, 5B and at a subsequent fabrication stage, a dielectric layer 62 is formed over the access gate transistors 12, 14 and the stacked gate transistors 16, 18. The dielectric layer 62 may be comprised of a dielectric material, such as silicon dioxide, that is an electrical insulator. Contacts 64, 66 are formed in the dielectric layer 62. The contact 64 is physically and electrically connected with the section of the silicide layer 60 on the source/drain region 52. A contact 66 is physically and electrically connected with the section of the silicide layer 60 on the source/drain region 54. The contacts 64, 66 may be comprised of a metal, such as tungsten, and may be formed within contact openings that are patterned by lithography and etching processes in the dielectric layer 62. An interconnect 68 may be subsequently formed that is coupled by the contact 64 to the section of the silicide layer 60 on the source/drain region 52, and an interconnect 70 may be subsequently formed that is coupled by the contact 66 to the section of the silicide layer 60 on the source/drain region 54.

In an embodiment, the contact 64 may penetrate only partially through the section of the silicide layer 60 on the source/drain region 52 due to the increased thickness of the silicide layer 60 on the source/drain region 52 such that the tip is surrounded by silicide and lands on silicide instead of penetrating fully through the silicide layer 60. The contact resistance between the source/drain region 52 and the contact 64 may be reduced due to the increased thickness of the section of the silicide layer 60 on the source/drain region 52.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a memory device, the structure comprising:
   a semiconductor substrate;
   a first source/drain region in the semiconductor substrate;
   a second source/drain region in the semiconductor substrate;
   a first gate stack on the semiconductor substrate, the first gate stack positioned in a lateral direction between the first source/drain region and the second source/drain region, the first gate stack including a first gate electrode and a second gate electrode, and the first gate electrode including a first plurality of segments spaced apart along a longitudinal axis of the first gate stack; and
   a second gate stack on the semiconductor substrate adjacent to the first gate stack, the second gate stack positioned in the lateral direction between the first source/drain region and the second source/drain region.

2. The structure of claim 1 further comprising:
   a plurality of shallow trench isolation regions in the semiconductor substrate,
   wherein the first gate electrode includes a plurality of gaps that alternate along the longitudinal axis with the first plurality of segments, each gap is positioned between an adjacent pair of the first plurality of segments of the first gate electrode, and each gap overlaps with the second gate electrode over one of the shallow trench isolation regions.

3. The structure of claim 2 wherein the first gate stack includes a dielectric layer having a second plurality of segments, and each of the second plurality of segments is positioned in a vertical direction between the second gate electrode and one of the first plurality of segments of the first gate electrode.

4. The structure of claim 2 wherein each of the first plurality of segments of the first gate electrode is positioned in the lateral direction adjacent to the first source/drain region.

5. The structure of claim 2 wherein each of the first plurality of segments of the first gate electrode has an overlapping relationship with a respective portion of the semiconductor substrate.

6. The structure of claim 2 wherein each of the first plurality of segments of the first gate electrode has a non-overlapping relationship with the plurality of shallow trench isolation regions.

7. The structure of claim 2 wherein the second gate electrode is positioned in a vertical direction between the first plurality of segments of the first gate electrode and the semiconductor substrate, and the second gate electrode is positioned in a vertical direction between the gaps and the semiconductor substrate.

8. The structure of claim 7 wherein first portions of the second gate electrode have an overlapping relationship with the plurality of shallow trench isolation regions, and second portions of the second gate electrode have an overlapping relationship with the semiconductor substrate.

9. The structure of claim 1 wherein the second gate electrode is positioned in a vertical direction between the first plurality of segments of the first gate electrode and the semiconductor substrate.

10. The structure of claim 1 further comprising:
    a third gate stack positioned adjacent to the first gate stack,
    wherein the first source/drain region is positioned in the lateral direction between the first gate stack and the third gate stack.

11. The structure of claim 10 further comprising:
    a silicide layer on the semiconductor substrate over the first source/drain region.

12. The structure of claim 11 further comprising:
    a contact coupled by the silicide layer to the first source/drain region.

13. The structure of claim 10 wherein the third gate stack includes a third gate electrode and a fourth gate electrode, and the third gate electrode includes a second plurality of segments spaced apart along a longitudinal axis of the third gate stack.

14. The structure of claim 13 wherein the first plurality of segments of the first gate electrode are aligned in the lateral direction with the second plurality of segments of the third gate electrode.

15. The structure of claim 1 wherein the second gate stack has a first gate electrode and a second gate electrode positioned in a vertical direction between the first gate electrode and the semiconductor substrate.

16. The structure of claim 1 wherein the first plurality of segments of the first gate electrode are positioned in the lateral direction adjacent to the first source/drain region, and each of the first plurality of segments has an overlapping relationship with a respective portion of the second gate electrode over the semiconductor substrate.

17. A method of forming a structure for a memory device, the method comprising:
    forming a first source/drain region and a second source/drain region in a semiconductor substrate;
    forming a first gate stack on the semiconductor substrate, wherein the first gate stack is positioned in a lateral direction between the first source/drain region and the second source/drain region, the first gate stack includes a first gate electrode and a second gate electrode, and the second gate electrode has a first plurality of segments spaced apart along a longitudinal axis of the first gate stack; and forming a second gate stack on the semiconductor substrate adjacent to the first gate stack, wherein the second gate stack is positioned in the lateral direction between the first source/drain region and the second source/drain region.

18. The method of claim 17 wherein forming the first gate stack on the semiconductor substrate comprises:
patterning the first gate electrode to form the first plurality of segments.

19. The method of claim 17 further comprising:
forming a third gate stack positioned adjacent to the first gate stack, wherein the first source/drain region is positioned in the lateral direction between the first gate stack and the third gate stack;
forming a silicide layer on the semiconductor substrate over the first source/drain region; and
forming a contact coupled by the silicide layer to the first source/drain region.

20. The method of claim 19 wherein the third gate stack includes a third gate electrode and a fourth gate electrode, and the third gate electrode includes a second plurality of segments spaced apart along a longitudinal axis of the third gate stack.

* * * * *